United States Patent
Yang

(10) Patent No.: US 11,838,027 B2
(45) Date of Patent: Dec. 5, 2023

(54) ALL-DIGITAL PHASE-LOCKED LOOP AND CALIBRATION METHOD THEREOF

(71) Applicant: Realtek Semiconductor Corp., HsinChu (TW)

(72) Inventor: Yu-Che Yang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/869,784

(22) Filed: Jul. 20, 2022

(65) Prior Publication Data

US 2023/0028270 A1   Jan. 26, 2023

(30) Foreign Application Priority Data

Jul. 26, 2021  (TW) ................... 110127373

(51) Int. Cl.
  *H03L 7/099*  (2006.01)
  *H03L 7/085*  (2006.01)
  *H03L 7/107*  (2006.01)

(52) U.S. Cl.
  CPC ............ *H03L 7/0991* (2013.01); *H03L 7/085* (2013.01); *H03L 7/107* (2013.01); *H03L 2207/50* (2013.01)

(58) Field of Classification Search
  CPC ... H03L 2207/00; H03L 2207/50; H03L 7/00; H03L 7/06; H03L 7/08; H03L 7/085; H03L 7/093; H03L 7/10; H03L 7/104
  See application file for complete search history.

(56) References Cited

U.S. PATENT DOCUMENTS 8,508,266 B2 *  8/2013  Frantzeskakis .......... H03L 7/08
                                                        327/147

FOREIGN PATENT DOCUMENTS

CN     103219993 B    3/2017

OTHER PUBLICATIONS

Robert Bogdan Staszewski, John L.Wallberg, Sameh Rezeq, Chih-Ming Hung, Oren E. Eliezer, Sudheer K. Vemulapalli, Chan Fernando, Ken Maggio, Roman Staszewski, Nathen Barton, Meng-Chang Lee, Patrick Cruise, Mitch Entezari, Khurram Muhammad, Dirk Leipold, "All-Digital Pll and Transmitter for Mobile Phones", JSSC, Dec. 2005,IEEE, USA.

* cited by examiner

*Primary Examiner* — Diana J. Cheng
(74) *Attorney, Agent, or Firm* — Winston Hsu

(57) ABSTRACT

An all-digital phase-locked loop (ADPLL) and a calibration method thereof are provided. The ADPLL includes a digitally controlled oscillator (DCO), a time-to-digital converter (TDC) coupled to the DCO, and a normalization circuit coupled to the TDC. The TDC is configured to generate a clock signal according to a frequency control signal. The TDC is configured to generate a digital output signal according to a phase difference between the clock signal and a reference signal. The normalization circuit is configured to convert the digital output signal into a clock phase value according to a gain parameter. The normalization circuit selects one of a plurality of candidate gain parameters stored in the normalization circuit in response to the digital output signal, for being utilized as the gain parameter.

9 Claims, 11 Drawing Sheets

ALL-DIGITAL PHASE-LOCKED LOOP AND CALIBRATION METHOD THEREOF

BACKGROUND OF THE INVENTION

1. Field of the Invention

The present invention is related to all-digital phase-locked loops (ADPLLs), and more particularly, to an ADPLL and a calibration method thereof such as a gain calibration method for a time-to-digital converter (TDC) within the ADPLL.

2. Description of the Prior Art

In operations of an all-digital phase-locked loop (ADPLL), a time-to-digital converter (TDC) may be utilized as a phase detector to convert a phase error between a reference signal and an output signal of a digitally controlled oscillator (DCO) into a digital code for performing subsequent processing in a digital domain. The TDC may have partial features of analog circuits, however. For example, resolution of the TDC may vary due to process-voltage-temperature (PVT) variations. As this varying resolution of the TDC may impact setting values of some parameters within the ADPLL, an estimation error of the resolution of the TDC may impact an overall performance of the ADPLL.

Thus, there is a need for a novel architecture and an associated calibration method that can properly obtain correct or optimized values of parameters related to the TDC (e.g., a gain of the TDC) under various process variations and temperature conditions.

SUMMARY OF THE INVENTION

An objective of the present invention is to provide an all-digital phase-locked loop (ADPLL) and a calibration method thereof, in order to set parameters related to a time-to-digital converter (TDC) for a better linearity of the TDC without introducing any side effect or in a way that is less likely to introduce side effects.

An embodiment of the present invention provides an ADPLL. The ADPLL comprises: a digitally controlled oscillator (DCO), configured to generate a clock signal according to a frequency control signal; a TDC, coupled to the DCO, configured to generate a digital output signal according to a phase error between the clock signal and a reference signal; and a normalization circuit, coupled to the TDC, configured to convert the digital output signal into a clock phase value according to a gain parameter and stores a plurality of candidate gain parameters; wherein the normalization circuit selects in response to the digital output signal one of the candidate gain parameters to be the gain parameter.

An embodiment of the present invention provides a calibration method of an ADPLL. The calibration method comprises: utilizing a DCO of the ADPLL to generate a clock signal according to a frequency control signal; utilizing a TDC of the ADPLL to generate a digital output signal according to a phase error between the clock signal and a reference signal; utilizing a normalization circuit of the ADPLL to convert the digital output signal into a clock phase value according to a gain parameter and storing a plurality of candidate gain parameters; and utilizing the normalization circuit to select in response to the digital output signal one of the candidate gain parameters to be the gain parameter.

The ADPLL and the calibration method thereof provided by the embodiments of the present invention can select corresponding gain parameters according to the digital output signal, to improve the linearity of the TDC. The calibration method of the present invention is not limited to resolution of the TDC. In addition, the ADPLL and the calibration method will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided to explain the concept of the present invention. Note that the components in each embodiment can be implemented by hardware (e.g., apparatus or circuit) or by firmware (e.g., a microprocessor with at least one program therein). Additionally, in following embodiments, the terms "first", "second", etc. are only for defining different components, parameters, data, signals or steps, and are not meant to be a limitation of the order thereof.

In operations of an all-digital phase-locked loop (ADPLL), assume that a cycle period of a clock signal CKV output by a digitally controlled oscillator (DCO) is $T_V$, and a time-to-digital converter (TDC) generates a digital output signal $N_r$ according to a phase error between the clock signal and a reference signal FREF (e.g., a time difference $\Delta t_r$ between a rising edge of the clock signal CKV and a rising edge of the reference signal FREF). The ADPLL needs to perform normalization on the digital output signal $N_r$ to convert the digital output signal $N_r$ into a value $\varnothing_{DCO}$ within a range from 0 to 1 (e.g., a value representing the phase error between the clock signal CKV and the reference signal FREF as $\varnothing_{DCO}$ times the cycle period $T_V$) for subsequent operations. The result of the above normalization may be affected by resolution $\Delta t_{res}$ of the TDC (e.g., a time difference corresponding to a least significant bit (LSB) of the digital output signal of the TDC, or a unit delay of the TDC), where $\varnothing_{DCO}=N_r\times\Delta t_{res}/T_V$, and the resolution $\Delta t_{res}$ of the TDC may vary due to process-voltage-temperature (PVT) variation of semiconductors. Thus, the operation of the normalization mentioned above needs to be calibrated in response to the varying resolution.

Figure 1:
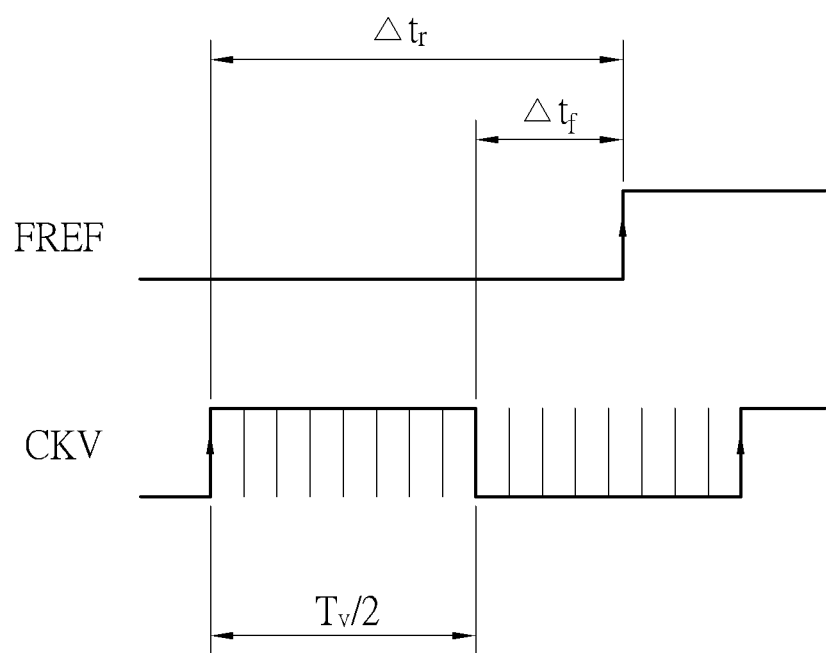
FIG. 1 is a diagram illustrating resolution of a time-to-digital converter (TDC) according to an embodiment of the present invention.

FIG. 1 is a diagram illustrating the resolution $\Delta t_{res}$ of a TDC according to an embodiment of the present invention. As shown in FIG. 1, the TDC may detect a time difference $\Delta t_r$ between a rising edge of the clock signal CKV and a rising edge of the reference signal FREF, and may further detect a time difference $\Delta t_f$ between a falling edge of the clock signal CKV and the rising edge of the reference signal FREF. As shown in FIG. 1, a difference value between $\Delta t_r$ and $\Delta t_f$ is a half cycle period $T_V/2$ of the clock signal CKV, and the TDC (or subsequent processing circuit thereof) may utilize respective digital output signals which are respectively output according to $\Delta t_r$ and $\Delta t_f$ to roughly calculate the resolution $\Delta t_{res}$ of the TDC.

Figure 2:
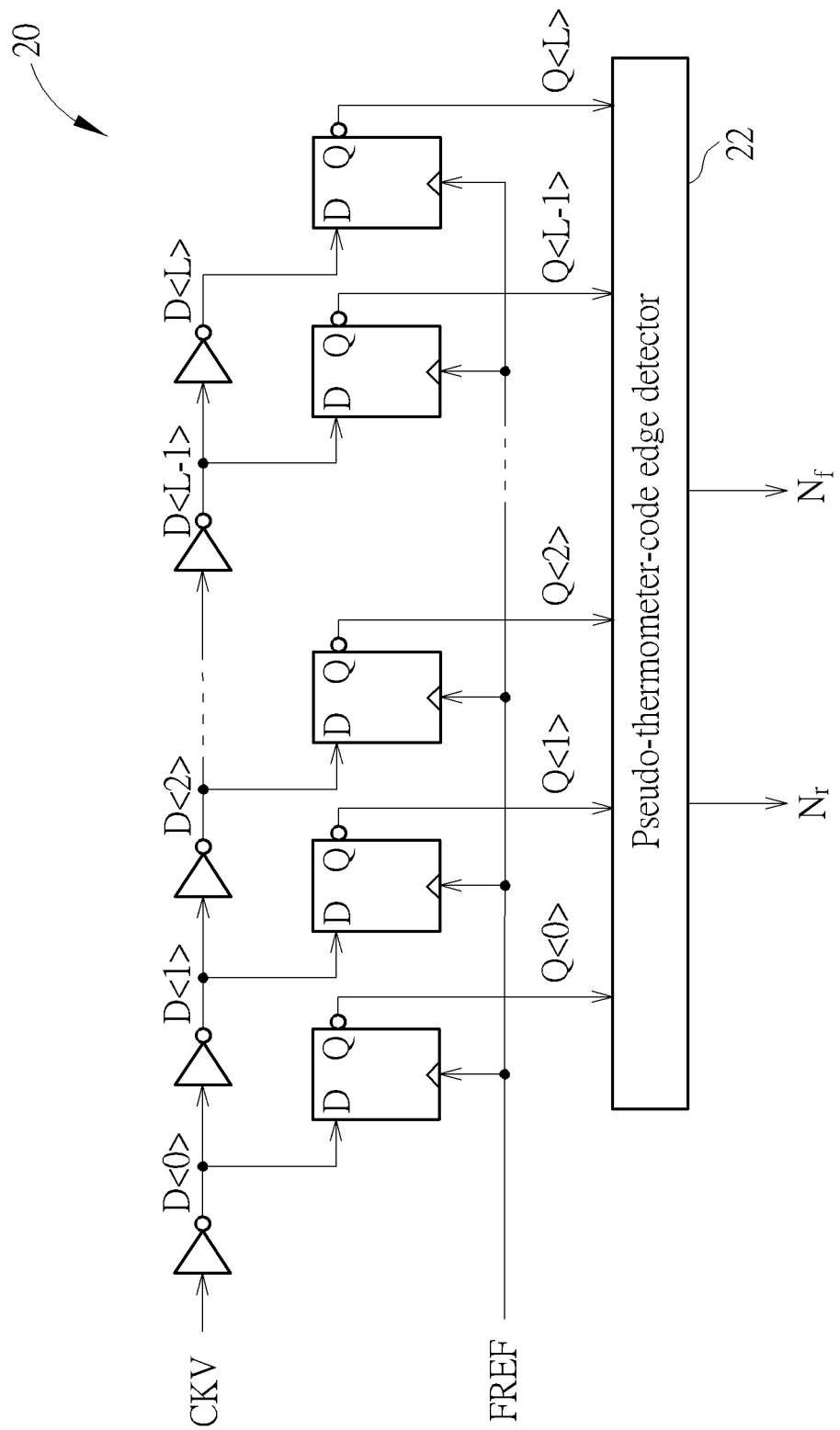
FIG. 2 illustrates a circuit architecture of a TDC according to an embodiment of the present invention.
Figure 3:
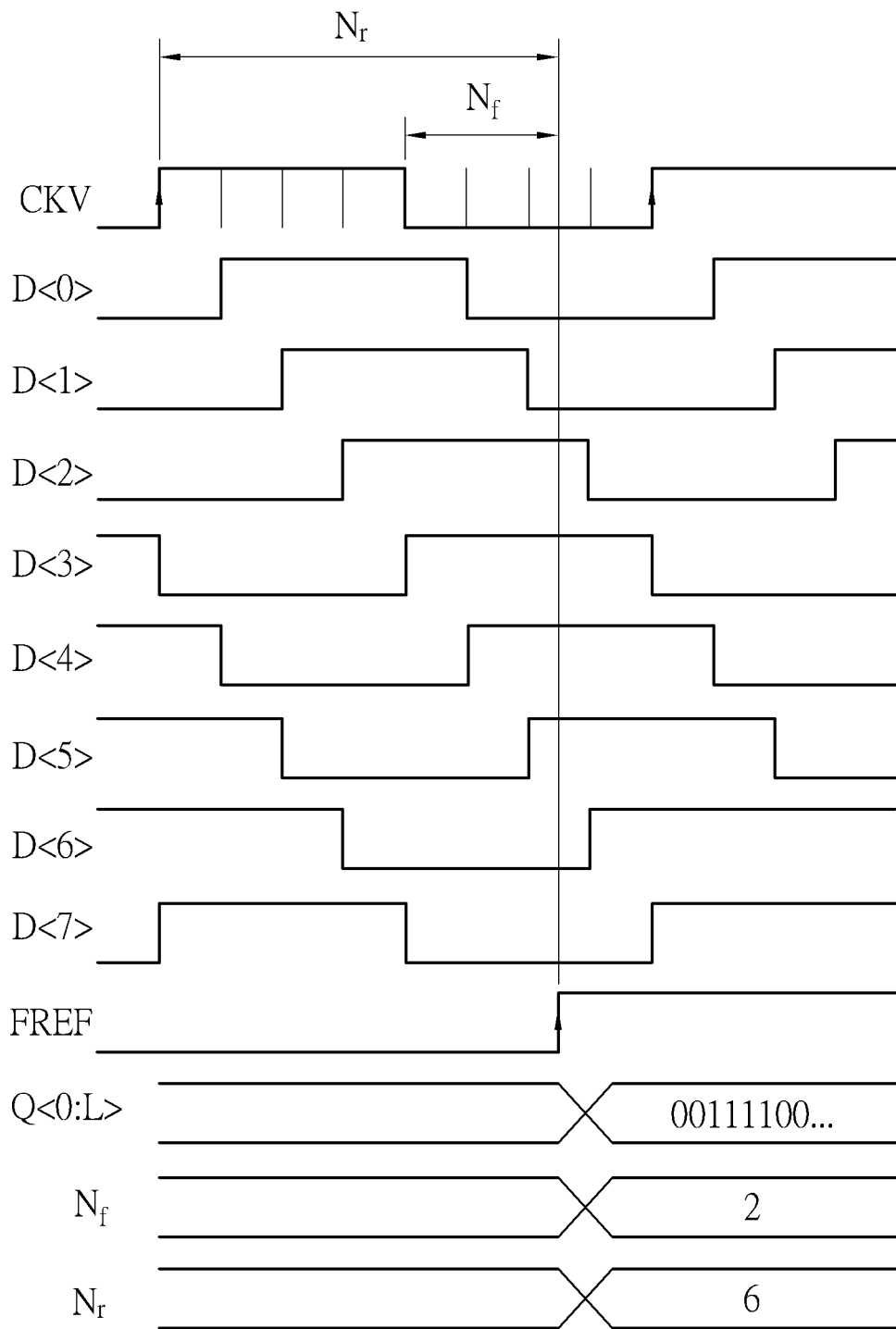
FIG. 3 illustrates some signals which are involved in the circuit architecture shown in FIG. 2.

FIG. 2 illustrates a circuit architecture of a TDC 20 according to an embodiment of the present invention, and FIG. 3 illustrates some signals which are involved in the circuit architecture shown in FIG. 2. It should be noted that the circuit architecture shown in FIG. 2 is an example of the TDC 20 only, and is not meant to be a limitation of the present invention. As shown in FIG. 2, the TDC 20 may comprise multiple inverters connected in series to form an inverter chain. As each inverter of these inverters may cause a delay of a signal, respective output signals D<0>, D<1>, D<2>, ..., D<L–1> and D<L> of these inverters may have corresponding delay periods relative to the clock signal CKV which is input to a first inverter of these inverters, as illustrated by D<0>, D<1>, D<2>, D<3>, D<4>, D<5>, D<6> and D<7> shown in FIG. 3, where a delay amount introduced by one inverter may be the resolution $\Delta t_{res}$ of the TDC 20. In this embodiment, each of the output signals D<0>, D<1>, D<2>, ..., D<L–1> and D<L> may be input to an input terminal (which is labeled "D") of a flip-flop, and may be output from an output terminal (labeled "Q") of the flip-flop when the flip-flop is triggered by the rising edge of the reference signal FREF, as illustrated by Q<0:L> shown in FIG. 3. In this embodiment, a portion of the output signals Q<0:L> which are changed from 0 to 1 (e.g., Q<1> is 0 and Q<2> is 1) may represent the falling edge of the clock signal CKV, and a portion of the output signals Q<0:L> which are changed from 1 to 0 (e.g., Q<5> is 1 and Q<6> is 0) may represent the rising edge of the clock signal CKV. The TDC 20 may utilize a pseudo-thermometer-code edge detector 22 (e.g., a detector configured to detect a change from 0 to 1 and a change from 1 to 0 in a digital sequence) therein to detect the output signals Q<0:L> and accordingly output digital output signals $N_r$ and $N_f$ in a binary format, for respectively representing the time difference $\Delta t_r$ between the rising edge of the clock signal CKV and the rising edge of the reference signal FREF and the time difference $\Delta t_f$ between the falling edge of the clock signal CKV and the rising edge of the reference signal FREF (e.g., $\Delta t_r \approx N_r \times \Delta t_{res}$ and $\Delta t_f \approx N_f \times \Delta t_{res}$). In an example, $N_r=6$ and $N_f=2$. It should be noted that the circuit architecture of TDC 20 shown in FIG. 2 is for illustrative purposes only, and is not meant to be a limitation of the present invention. For example, a bit count of each of the output signals of the TDC may vary according to requirements of the system, and L may be any positive integer.

Figure 4:
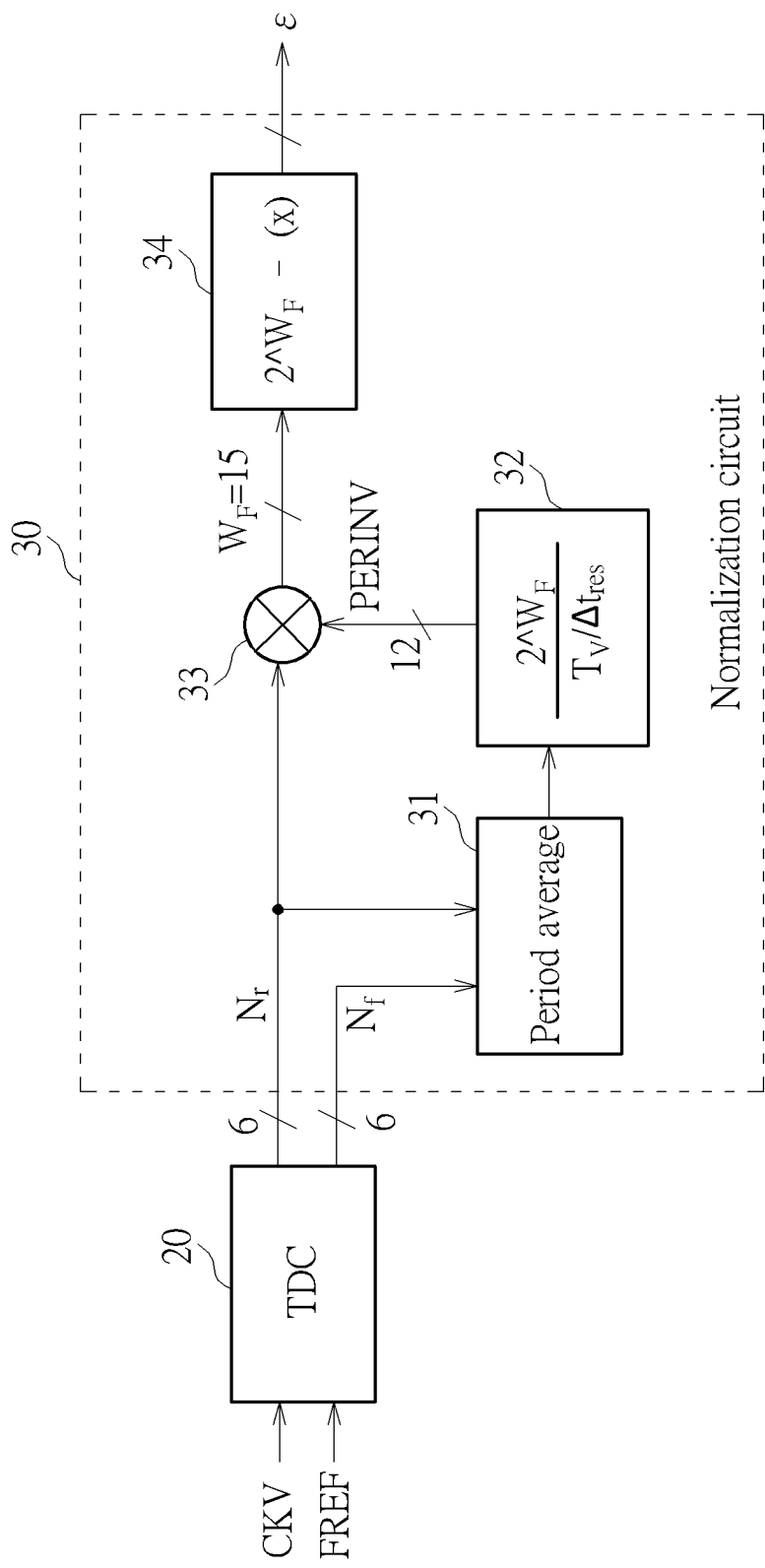
FIG. 4 is a diagram illustrating a normalization operation of a TDC according to an embodiment of the present invention.

FIG. 4 is a diagram illustrating a normalization operation of the TDC 20 according to an embodiment of the present invention. As shown in FIG. 4, the TDC 20 may transmit the digital output signal $N_r$ and $N_f$ obtained from the above operations to a normalization circuit 30. Initially, the normalization circuit 30 may utilize a first calculating unit 31 (which is labeled "Period average" for better comprehension) to perform the calculation mentioned in the embodiment of FIG. 1 to obtain an average $\overline{T_V}$ of a cycle period of the clock signal CKV and the resolution $\Delta t_{res}$ of the TDC 20, and then utilize a second calculating unit 32 (which is labeled $$"\frac{2^{\wedge}W_F}{\overline{T_V}/\Delta t_{res}}"$$

for better comprehension) to output the reciprocal of $\overline{T_V}/\Delta t_{res}$ in a binary form (e.g., a signal PERINV). The normalization circuit 30 further utilizes a multiplier 33 to multiply the digital output signal $N_r$ by the signal PERINV to generate a $W_F$-bit multiplied result (e.g., $W_F=15$), and then finally transforms the multiplied result into an unsigned 2's complement form via a third calculating unit 34 (which is labeled "$2^{\wedge}W_F-(x)$") to output a signal $\varepsilon$, where the $W_F$-bit binary signal $\varepsilon$ may be illustrated in a manner of discrete data (e.g., a $k^{th}$ set of data) as follows:

$$\varepsilon[k] = 2^{W_F} \cdot \left(1 - \frac{N_r[k]}{\overline{T_V}/\Delta t_{res}}\right)$$

It should be noted that when a duty cycle of the clock signal CKV is not 50%, the aforementioned operations of obtaining the average $\overline{T_V}$ of the cycle period of the clock signal CKV and the resolution $\Delta t_{res}$ of the TDC 20 may need to be implemented by a more complex hardware. In addition, the estimation method mentioned above is limited by the resolution $\Delta t_{res}$ of the TDC 20, and estimation errors may exist, which degrades the performance of the ADPLL (e.g., output spur becomes too big).

Figure 5:
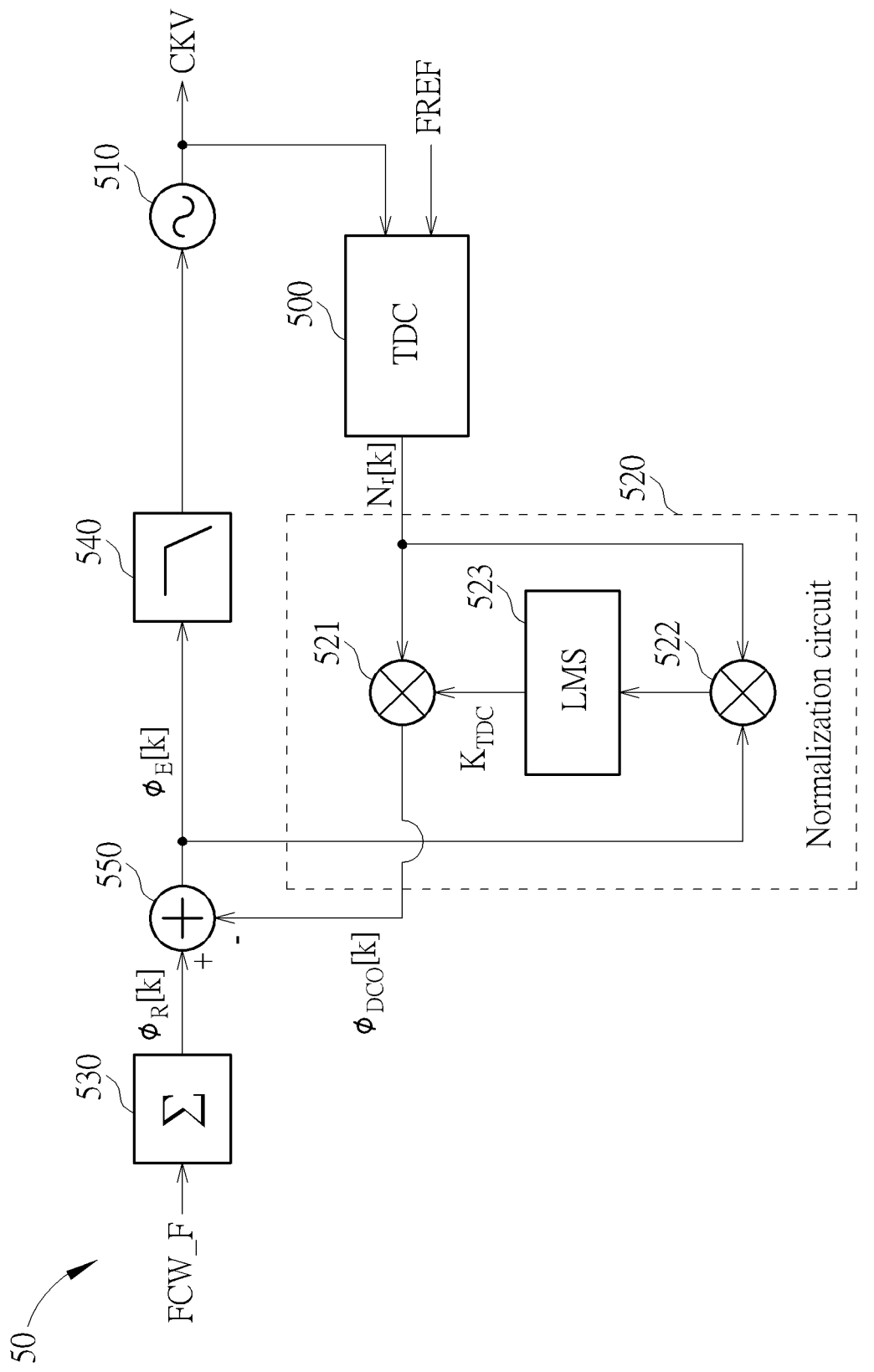
FIG. 5 is a diagram illustrating an all-digital phase-locked loop (ADPLL) according to an embodiment of the present invention.

For brevity, the following description takes values in a decimal form. FIG. 5 is a diagram illustrating an ADPLL 50 according to an embodiment of the present invention, where the ADPLL 50 may comprise a TDC 500, a digitally controlled oscillator (DCO) 510 (which is illustrated by a circle with a sine wave therein for better comprehension), a normalization circuit 520, an accumulator 530 (which is labeled "Σ" for better comprehension), a low pass filter 540 (which is illustrated by a box with a low pass response waveform therein for better comprehension) and an adder 550 (which is illustrated by a circle with "+" therein for better comprehension). In this embodiment, a parameter FCW_F may be set as a ratio value between a target frequency of the clock signal CKV and a frequency of the reference frequency FREF, and the accumulator 530 may continuously accumulate the parameter FCW_F to output an accumulated result as a reference phase. The TDC 500 may be coupled to the DCO 510, and may be configured to generate a digital output signal $N_r[k]$ (e.g.) according to a phase error between the clock signal CKV and the reference signal FREF. The normalization circuit 520 may be coupled to the TDC 500, and may be configured to convert the digital output signal $N_r[k]$ into a clock phase value $\varnothing_{DCO}[k]$ (e.g., a value of $\varnothing_{DCO}$ at the $k^{th}$ cycle of the reference signal FREF) according to a gain parameter $K_{TDC}$, where the clock phase value $\varnothing_{DCO}[k]$ may be regarded as a result of performing normalization on the digital output signal $N_r[k]$. The adder 550 may perform subtraction on the reference phase mentioned above with a real-time phase (e.g., an accumulated result of a real-time ratio value between a real-time frequency of the clock signal CKV and the frequency of the reference signal FREF) to obtain a phase error value $\varnothing_E[k]$ (e.g., a value of $\varnothing_E$ at the $k^{th}$ cycle of the reference signal FREF), and the low pass filter 540 may generate a frequency control signal according to the phase error value $\varnothing_E[k]$, in order to control the DCO 510 to generate the clock signal CKV according to the frequency control signal, and thereby make the real-time frequency of the clock signal CLK gradually approach the target frequency.

It should be noted that the digital output signal $N_r[k]$ generated by the TDC 500 and the clock phase value $\varnothing_{DCO}[k]$ after the normalization are merely configured to represent a fractional portion of the real-time phase, and an integer portion of the real-time phase may be calculated by a counter. As operations of utilizing the counter to generate the integer portion of the real-time phase are well-known by those skilled in this art, and do not affect implementation of calibration of the TDC 500 and the normalization circuit 520, the counter is not shown in FIG. 5 for brevity, and related details are omitted here for brevity. Similarly, a reference phase value $\varnothing_R[k]$ (e.g., a value of $\varnothing_R$ at the $k^{th}$ cycle of the reference signal FREF) output by the accumulator 530 shown in FIG. 5 merely represents a fractional portion of the reference phase mentioned above for brevity.

In the embodiment of FIG. 5, the normalization circuit 520 may comprise a multiplier 521, configured to multiply the digital output signal $N_r[k]$ by the gain parameter $K_{TDC}$ to generate the clock phase value $\varnothing_{DCO}[k]$, and a correct value of the gain parameter $K_{TDC}$ may be obtained by the following equation:

$$K_{TDC} = \frac{t_{res}}{T_{DCO}}$$

where $t_{res}$ may represent resolution of the TDC 500 (e.g., $\Delta t_{res}$ mentioned above), and $T_{DCO}$ may represent a cycle period of the clock signal CKV output from the DCO 510 (e.g., $T_V$ or $\overline{T_V}$ mentioned above). As the resolution $t_{res}$ of the TDC 500 is quite sensitive to the PVT variation (e.g., $t_{res}$ is 13 picoseconds (ps) when the temperature is 25° C., and $t_{res}$ is 10 ps when the temperature is 80° C.), the gain parameter $K_{TDC}$ may have gain error under different temperatures, and the gain error of the gain parameter may result in occurrence of unwanted frequency components such as fractional spur.

Assuming that the frequency of the reference signal FREF is 40 MHz, the ratio value FCW between the target frequency of the clock signal CKV and the frequency of the reference signal FREF is 125.25, the expected resolution $t_{res}$ is 10 μs, and the target frequency such as $f_{DCO}$ of the clock signal CKV, then the gain parameter is about 0.05.

Figure 6:
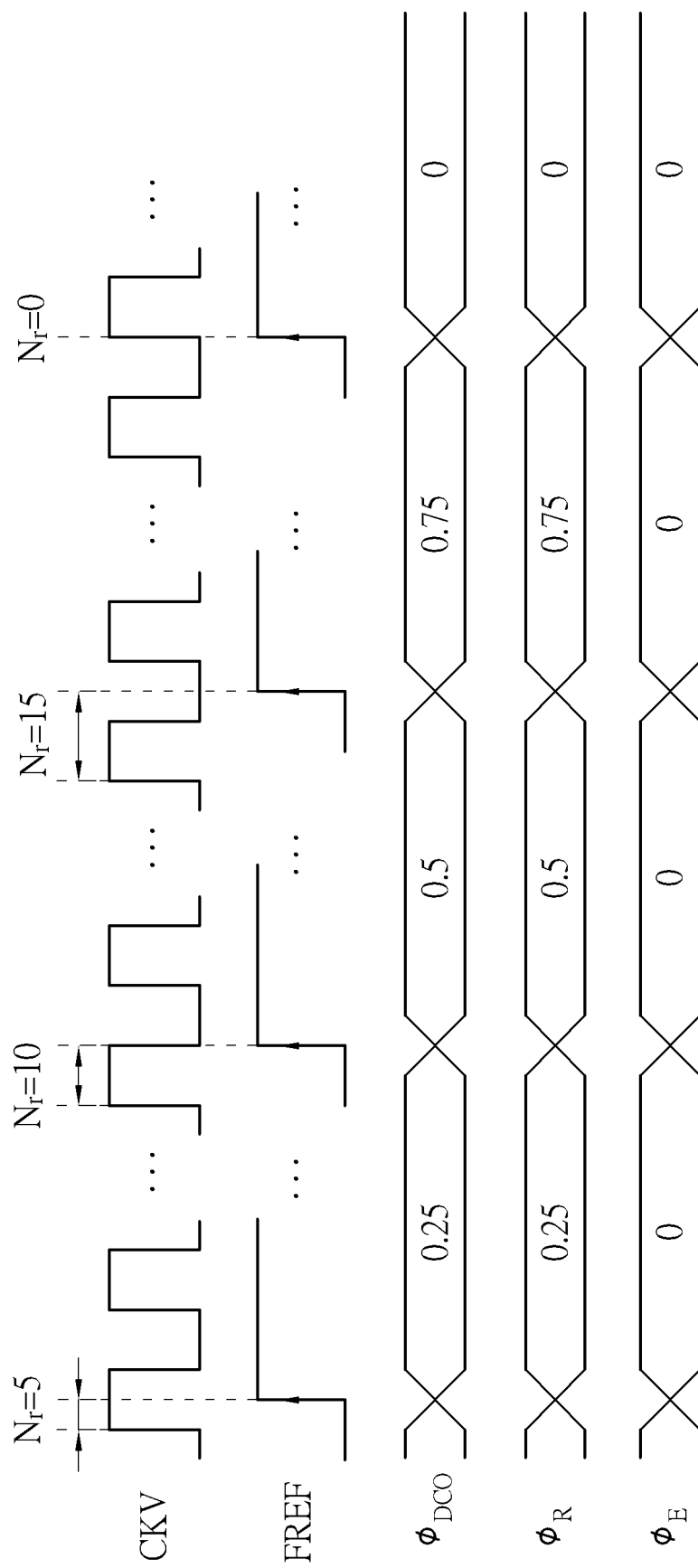
FIG. 6 illustrates some signals at a locked state under an ideal condition according to an embodiment of the present invention.
Figure 7:
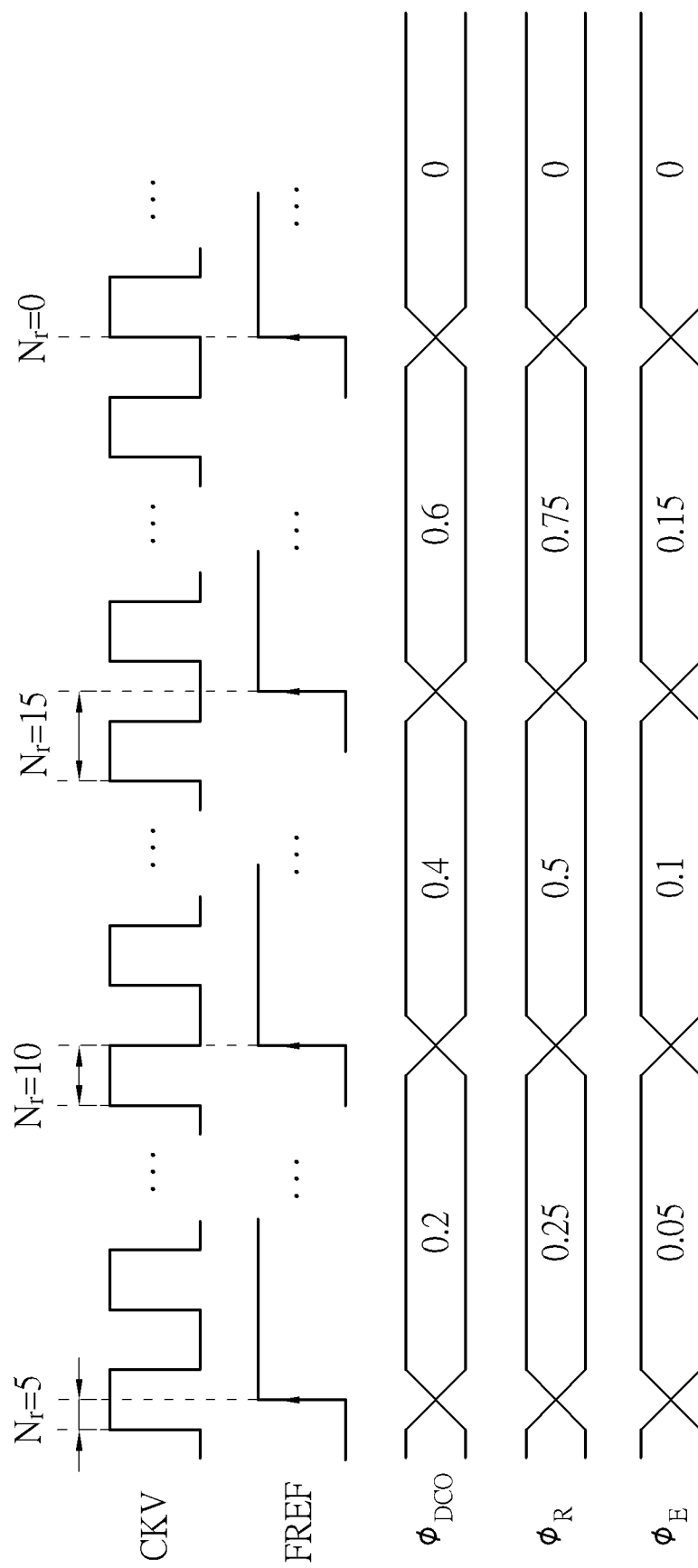
FIG. 7 illustrates some signals at a locked state when a TDC gain has −20% error according to an embodiment of the present invention.
Figure 8:
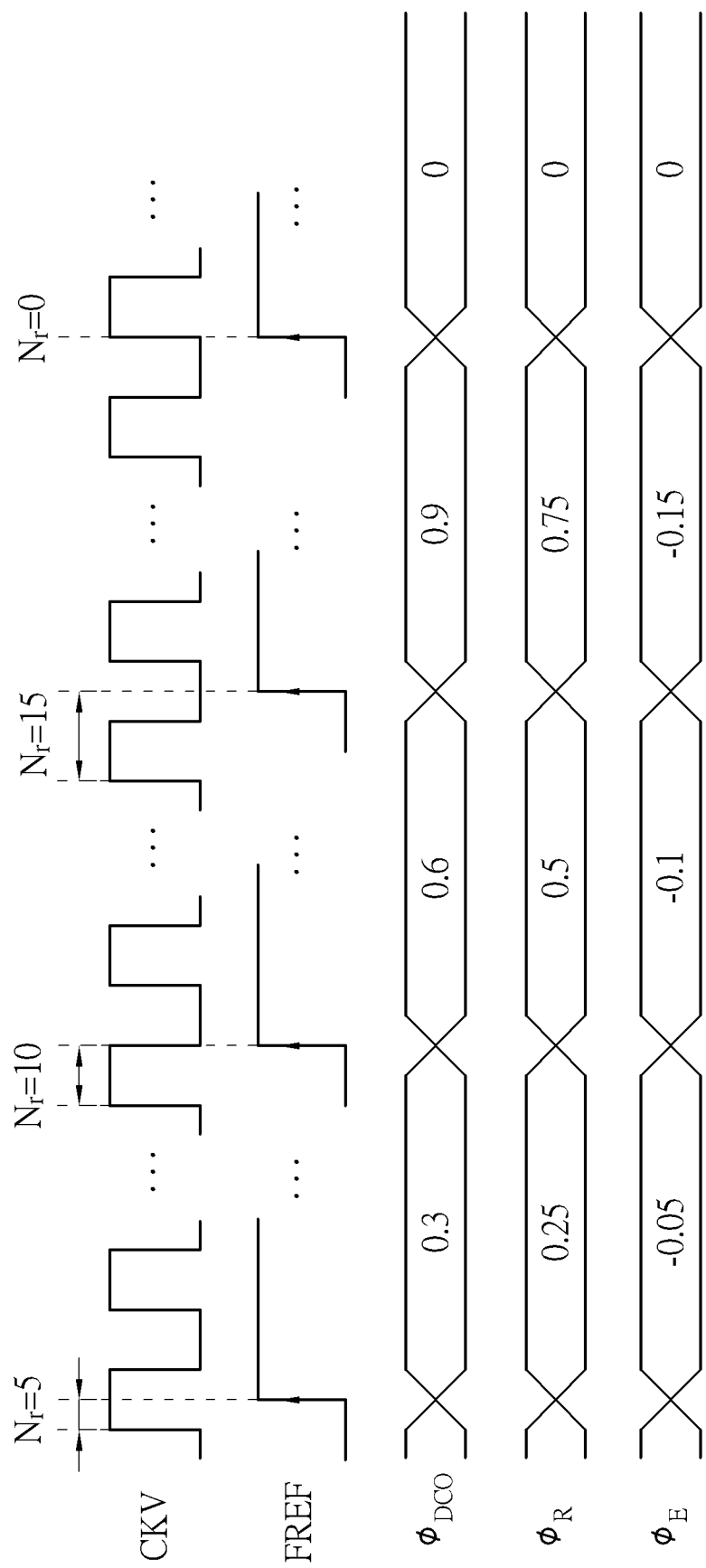
FIG. 8 illustrates some signals at a locked state when a TDC gain has +20% error according to an embodiment of the present invention.

FIG. 6 to FIG. 8 illustrate values of the clock phase $\varnothing_{DCO}$, the reference phase $\varnothing_R$, and the phase error $\varnothing_E$, based on the frequencies of the clock signal CKV and the reference signal FREF under different conditions. As shown in FIG. 6, in respective cycles of the reference signal FREF, the digital output signal $N_r$ is sequentially 5, 10, 15 and 0, and the reference phase $\varnothing_R$ is sequentially 0.25, 0.5, 0.75 and 0. Under a condition where the gain parameter $K_{TDC}$ has no gain error (e.g., both a gain parameter corresponding to actual resolution $t_{res}$ (i.e., $t_{res}/T_{DCO}$) and the value of the gain parameter $K_{TDC}$ which is set in advance are 0.05), the clock phase $\varnothing_{DCO}$ is sequentially 0.25, 0.5, 0.75 and 0, and therefore the phase error $\varnothing_E$ is kept at 0. When the gain parameter $K_{TDC}$ set in advance has −20% error (e.g., 0.04), the clock phase $\varnothing_{DCO}$ is sequentially 0.2, 0.4, 0.6 and 0, which makes the phase error $\varnothing_E$ still have a positive phase error (e.g., 0.05, 0.1, 0.15 and 0) at a locked state as shown in FIG. 7. When the gain parameter $K_{TDC}$ set in advance has +20% error (e.g., 0.06), the clock phase $\varnothing_{DCO}$ is sequentially 0.3, 0.6, 0.9 and 0, which makes the phase error $\varnothing_E$ still have a negative phase error (e.g., −0.05, −0.1, −0.15 and 0) at a locked state as shown in FIG. 8.

According to the above example, it can be observed that the gain parameter $K_{TDC}$ has correlation with the digital output signal $N_r[k]$ and the phase error $\varnothing_E[k]$. For example, a higher value of $N_r[k]$ may result in a high value of the phase error $\varnothing_E[k]$. In another example, a positive gain error of the gain parameter $K_{TDC}$ may result in a negative phase error $\varnothing_E[k]$, and a negative gain error of the gain parameter $K_{TDC}$ may result in a positive phase error $\varnothing_E[k]$.

Thus, embodiments of the present invention provide a calibration method and an associated architecture which utilize the digital output signal $N_r[k]$ and/or the phase error $\varnothing_E[k]$ for calibrating the gain parameter $K_{TDC}$.

As shown in FIG. 5, in addition to the multiplier 521, the normalization circuit 520 may further comprise a multiplier 522 and a least mean square (LMS) circuit 523 (which is labeled "LMS" for brevity), where the LMS circuit 523 is coupled between the multipliers 521 and 522. In this embodiment, the normalization circuit 520 may modify the gain parameter $K_{TDC}$ according to the phase error value $\varnothing_E[k]$ between the clock phase value $\varnothing_{DCO}[k]$ and the reference phase value $\varnothing_R[k]$. In particular, when the phase error value $\varnothing_E[k]$ is positive (as shown in FIG. 7), it means the gain parameter $K_{TDC}$ has a negative error (e.g. the gain parameter is less than $t_{res}/T_{DCO}$), and the normalization circuit 520 may increase the gain parameter $K_{TDC}$; and when the phase error value $\varnothing_E[k]$ is negative (as shown in FIG. 8), it means the gain parameter $K_{TDC}$ has a positive error (e.g. the gain parameter is greater than $t_{res}/T_{DCO}$), and the normalization circuit 520 may decrease the gain parameter $K_{TDC}$.

In this embodiment, the normalization circuit 520 may modify the gain parameter $K_{TDC}$ according to the phase error value $\varnothing_E[k]$ and the digital output signal $N_r$. For example, the normalization circuit 520 may modify the gain parameter $K_{TDC}$ according to a product $\varnothing_E[k] \times N_r$ of the phase error value $\varnothing_E[k]$ and the digital output signal $N_r$. As shown in FIG. 5, the normalization circuit 520 may utilize the multiplier 522 to calculate the product $\varnothing_E[k] \times N_r$ of the phase error value $\varnothing_E[k]$ and the digital output signal $N_r$, in order to make the LMS circuit 523 modify the gain parameter $K_{TDC}$ according to a calculation result of $\varnothing_E[k] \times N_r$.

Figure 9:
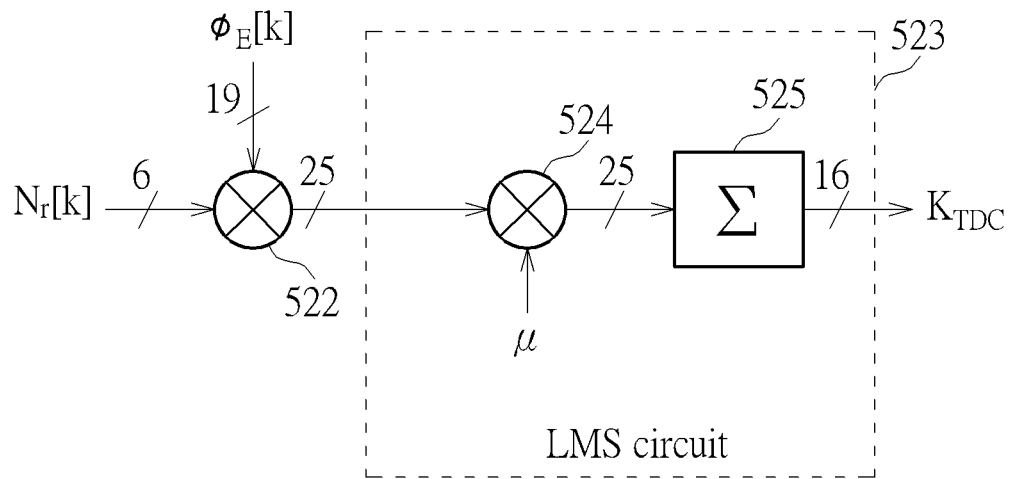
FIG. 9 is an example of a least mean square (LMS) circuit shown in FIG. 5 according to an embodiment of the present invention.

FIG. 9 is an example of the LMS circuit 523 shown in FIG. 5 according to an embodiment of the present invention. As shown in FIG. 9, the LMS circuit 523 may comprise a multiplier 524 and an accumulator 525 (which is labeled "Σ" for better comprehension). In this embodiment, the LMS circuit 523 may be configured to generate a next gain parameter $K_{TDC}[k]$ for a next cycle (e.g., the $k^{th}$ cycle of the reference signal FREF) according to the product $Ø_E[k]×N_r$ of the phase error $Ø_E[k]$ value and the digital output signal $N_r$ and a current gain parameter $K_{TDC}[k-1]$ utilized in a current cycle (e.g., a $(k-1)^{th}$ cycle of the reference signal FREF). For example, the multiplier 522 may multiply a 19-bit phase error value $Ø_E[k]$ by a 6-bit digital output signal $N_r[k]$ to generate a 25-bit product $Ø_E[k]×N_r$. The multiplier 524 may further multiply the product $Ø_E[k]×N_r$ by a predetermined value μ, and the accumulator 525 may accumulate a multiplied result to the gain parameter $K_{TDC}[k-1]$ to obtain a 16-bit gain parameter $K_{TDC}[k]$, where the predetermined value μ may be any suitable constant value, and related calculation may be expressed in discrete data as follows:

$$K_{TDC}[k]=K_{TDC}[k-1]+μ\{N_r[k]·Ø_E[k]\}$$

It should be noted that the equation mentioned above and the architecture shown in FIG. 9 are merely an example of the LMS circuit 523 calibrating the gain parameter $K_{TDC}$, and is not meant to be a limitation of the present invention. As long as the gain parameter $K_{TDC}$ may be gradually modified or converge to $t_{res}/T_{DCO}$ according to the phase error value $Ø_E[k]$ and/or the digital output signal $N_r[k]$, alternative designs should belong to the scope of the present invention.

Figure 10:
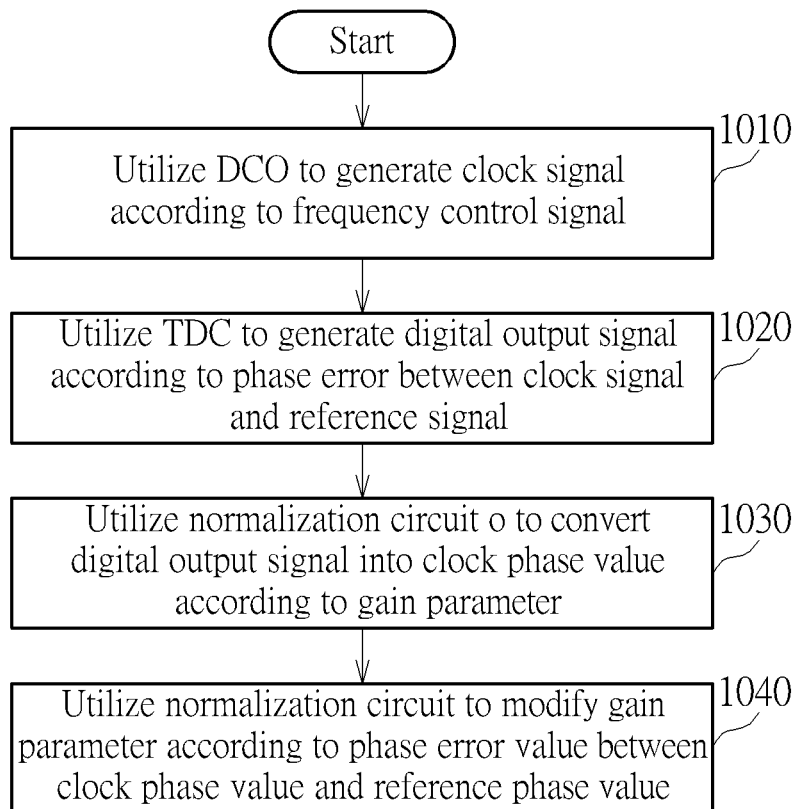
FIG. 10 is a diagram illustrating a working flow of a calibration method of an ADPLL according to an embodiment of the present invention.

FIG. 10 is a diagram illustrating a working flow of a calibration method of an ADPLL according to an embodiment of the present invention, where the calibration method is applicable to the ADPLL 50 shown in FIG. 5. It should be noted that, as long as an overall result is not hindered, one or more steps may be added, deleted or modified in the working flow shown in FIG. 10, and these steps do not have to be executed in the exact order shown in FIG. 10.

In Step 1010, the ADPLL 50 utilizes the DCO 510 to generate the clock signal CKV according to a frequency control signal.

In Step 1020, the ADPLL 50 utilizes the TDC 500 to generate the digital output signal $N_r[k]$ according to a phase error between the clock signal CKV and the reference signal FREF.

In Step 1030, the ADPLL 50 utilizes the normalization circuit 520 to convert the digital output signal $N_r[k]$ into the clock phase value $Ø_{DCO}[k]$ according to the gain parameter $K_{TDC}$.

In Step 1040, the ADPLL 50 utilizes the normalization circuit 520 to modify the gain parameter $K_{TDC}$ according to the phase error value $Ø_E[k]$ between the clock phase value $Ø_{DCO}[k]$ and the reference phase value $Ø_R[k]$.

To summarize, the embodiments of the present invention provide an ADPLL and a calibration method thereof, which can determine a direction or tendency of an error of the gain parameter $K_{TDC}$ according to the phase error value $Ø_E[k]$ and the signal $N_r$ output from a TDC, and establish a feedback calibration mechanism to make the gain parameter $K_{TDC}$ gradually converge to a correct value. In addition, the calibration mechanism of the present invention is not limited to resolution of the TDC, and more particularly, the accuracy and the precision of the calibration may be determined according to the design of the number of bits of calculating units (e.g., the multiplier 521 and 522, and the LMS circuit 523) within the normalization circuit 520. Thus, the present invention can make parameters related to the TDC (e.g., the gain parameter $K_{TDC}$ of the TDC) converge to a correct or optimized value.

In the previous embodiment, the normalization circuit 520 calibrates the gain parameter $K_{TDC}$ in real time. A current gain parameter $K_{TDC}$ may be affected by a previous gain parameter $K_{TDC}$ and a current phase error $Ø_E[k]$, however. Even if the digital output signal $N_r$ remains the same, the gain parameter $K_{TDC}$ may be generated to have a greater error, and the linearity of the TDC 500 may be accordingly impacted.

Thus, the present invention further provides an ADPLL and a calibration method thereof, which select one of a plurality of candidate gain parameters in response to the digital output signal $N_r$, for being utilized as the gain parameter. In one embodiment, the candidate gain parameters are generated by the normalization circuit 520 according to a plurality of phase error values and a plurality of previous digital output signals. For example, a candidate gain parameter $K_{TDC}[n-2]$ is generated according to a phase error value $Ø_E[n-2]$ and a digital output signal $N_r[n-2]$, a candidate gain parameter $K_{TDC}[n-1]$ is generated according to a phase error value $Ø_E[n-1]$ and a digital output signal $N_r[n-1]$, and a candidate gain parameter $K_{TDC}[n]$ is generated according to a phase error value $Ø_E[n]$ and a digital output signal $N_r[n]$. The gain parameters $K_{TDC}[n-2]$, $K_{TDC}[n-1]$ and $K_{TDC}[n]$ may be stored in the normalization circuit 520. When the value of the digital output signal $N_r$ is $N_r[n]$ again, the candidate gain parameter $K_{TDC}[n]$ may be selected from the plurality of the stored gain parameters and output to the multiplier 521, rather than generating the gain parameter $K_{TDC}$ in real time as illustrated in the embodiment of FIG. 5.

Figure 11:
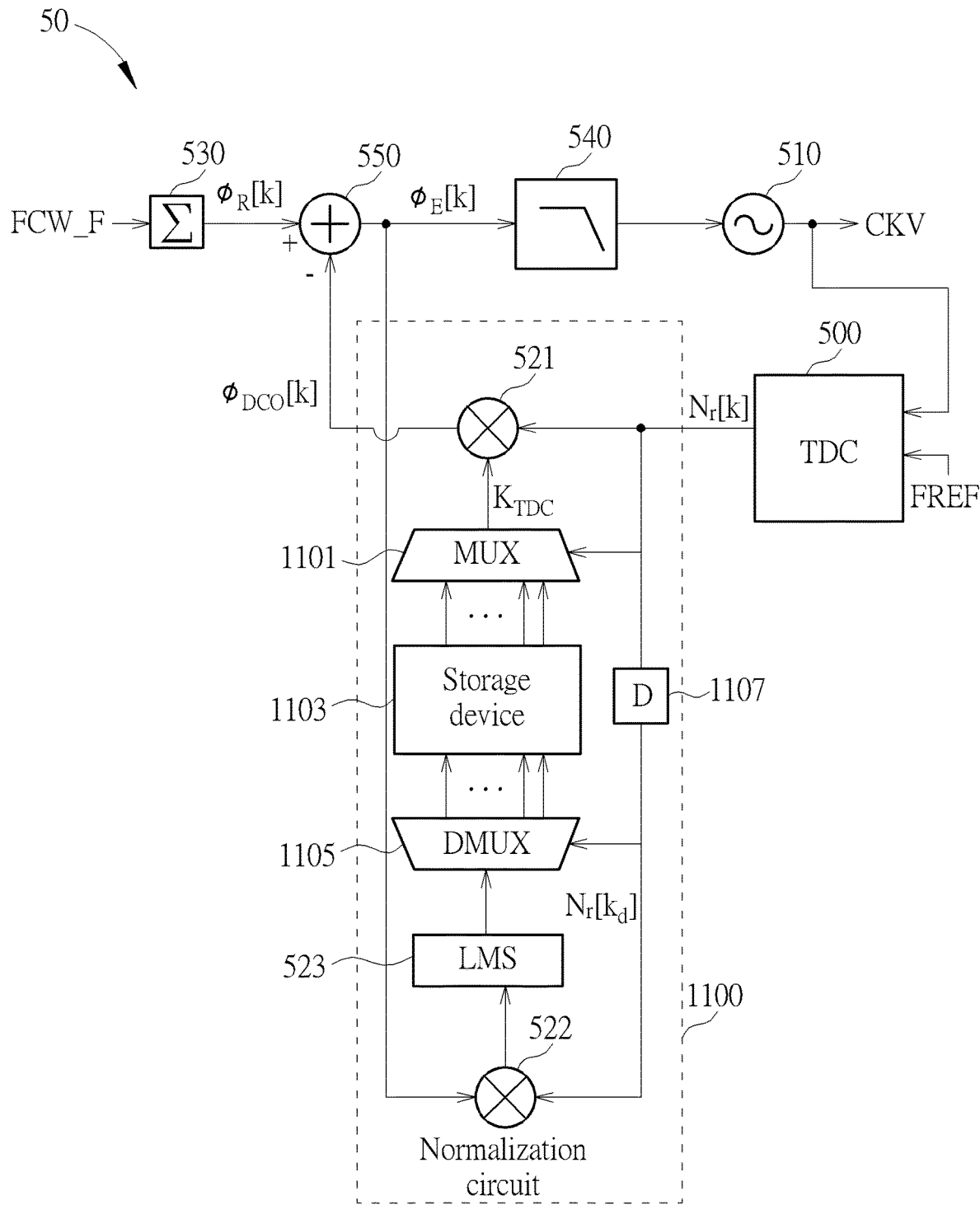
FIG. 11 is a diagram illustrating an ADPLL according to another embodiment of the present invention.

FIG. 11 is a diagram illustrating an ADPLL according to another embodiment of the present invention. In the embodiment of FIG. 11, in addition to the components shown in FIG. 5, a normalization circuit 1100 may further comprise a multiplexer (MUX) 1101, a storage device 1103, a de-multiplexer (DEMUX) 1105 and a first delay circuit 1107. The multiplexer 1101 is controlled by the digital output signal $N_r[k]$. The DEMUX 1105 is controlled by a delayed digital output signal $N_r[k_d]$, and the DEMUX 1105 is coupled to an output terminal of the LMS circuit 523. The storage device 1103 is coupled to a plurality of input terminals of the MUX 1101 and a plurality of output terminals of the DEMUX 1105, and is configured to store the candidate gain parameters. In one embodiment, the storage device 1103 comprises multiple registers for storing the candidate gain parameters. The first delay circuit 1107 is coupled to the MUX 1101 and the DEMUX 1105, and is configured to receive the digital output signal $N_r[k]$ to generate the delayed digital output signal $N_r[k_d]$.

In the embodiment of FIG. 11, the MUX 1101 may select a corresponding candidate gain parameter according to the digital output signal $N_r[k]$ at first. The LMS circuit 523 then generates the candidate gain parameter corresponding to the delayed digital output signal $N_r[k_d]$ according to the delayed digital output signal $N_r[k_d]$ and the phase error $Ø_E[k]$. The normalization circuit 1100 may update the candidate gain parameter corresponding to the digital output signal $N_r[k]$ stored in the storage device 1103 according to the candidate gain parameter corresponding to the delayed digital output signal $N_r[k_d]$. In one embodiment, the candidate gain parameters would not be updated, where after the candidate gain parameters have been generated according to the digital output signal $N_r[k]$, same values of these candidate gain parameters continue to be used without being changed.

Figure 12:
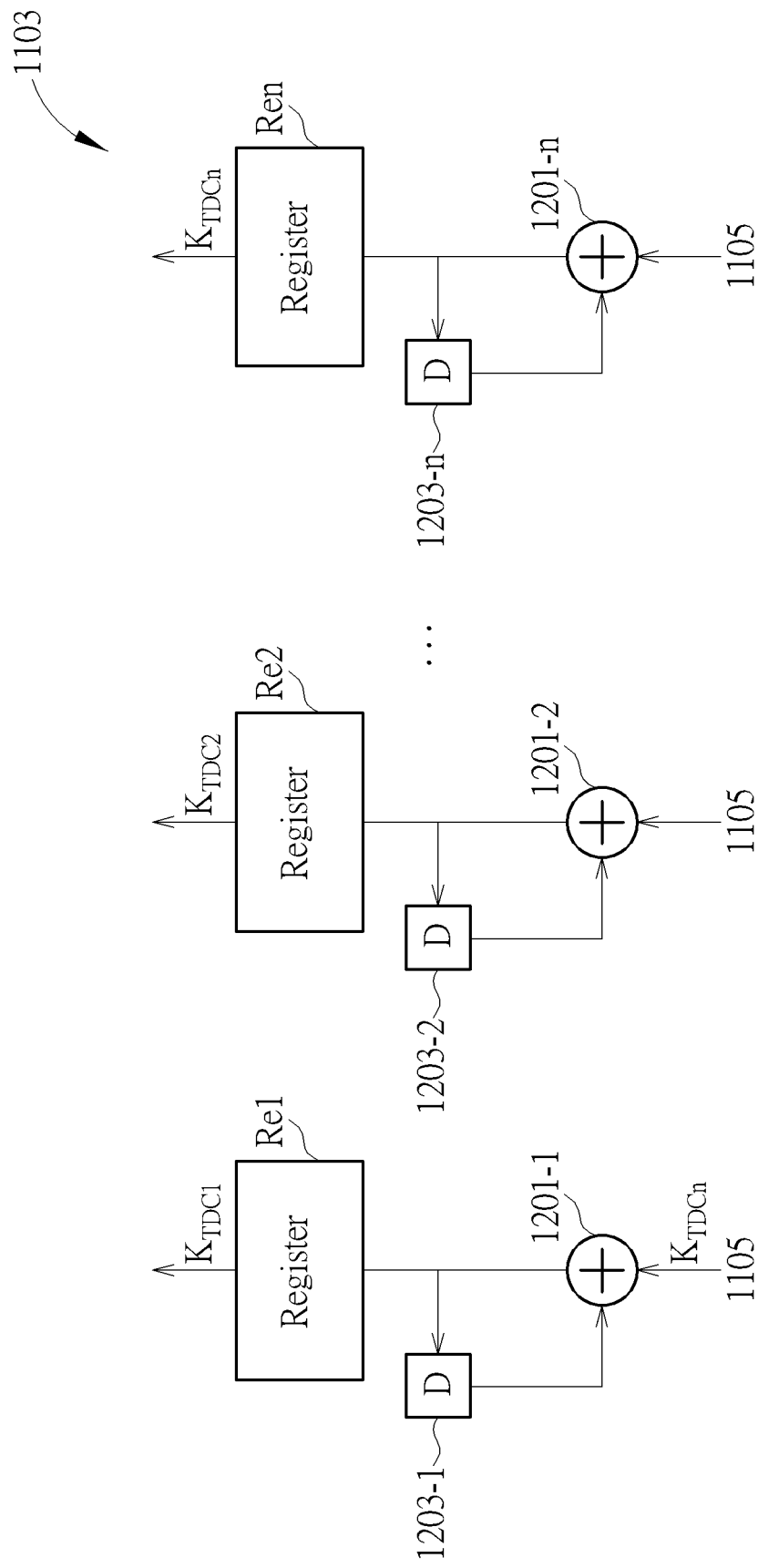
FIG. 12 is a diagram illustrating a storage device according to an embodiment of the present invention.

FIG. 12 is a diagram illustrating the storage device 1103 according to an embodiment of the present invention, where the candidate gain parameters stored in the storage device 1103 may be updated. As shown in FIG. 12, the storage device 1103 comprises a plurality of registers Re1, Re2, . . . and Ren, a plurality of adders 1201-1, 1201-2, ... and 1201-n, and a plurality of second delay circuits 1203-1, 1203-2, ... and 1203-n. The registers Re1, Re2, ... and Ren are configured to store candidate gain parameters $K_{TDC1}$, $K_{TDC2}$, ... and $K_{TDCn}$, respectively. The adders 1201-1, 1201-2, ... and 1201-n are respectively coupled to the registers Re1, Re2, ... and Ren, and are further coupled to the DEMUX 1105. The second delay circuits 1203-1, 1203-2, ... and 1203-n are respectively coupled to the registers Re1, Re2, ... and Ren, and are further respectively coupled to the adders 1201-1, 1201-2, ... and 1201-n. In the embodiment of FIG. 12, the candidate gain parameters $K_{TDC1}$, $K_{TDC2}$, ... and $K_{TDCn}$ which are originally stored in the registers Re1, Re2, ... and Ren may be delayed by the second delay circuit 1203-1, 1203-2, ... and 1203-n, respectively, and after being added to the gain parameters generated according to the delayed digital output signal $N_r[k_d]$, new candidate gain parameters may be generated and updated into the registers Re1, Re2, ... and Ren.

For example, if the TDC 500 shown in FIG. 11 generates a digital output signal $N_r[1]$, the MUX 1101 shown in FIG. 11 may be controlled by the digital output signal $N_r[1]$ and output the candidate gain parameter $K_{TDC1}$ stored in the register Re1 for being utilized as the gain parameter $K_{TDC}$. The digital output signal $N_r[k]$ may be delayed by the first delay circuit 1107 shown in FIG. 11 to generate a delayed digital output signal $N_r[1_d]$ (not shown). The LMS circuit 523 may generate a delayed gain parameter $K_{TDC1d}$ according to the delayed digital output signal $N_r[1_d]$ and a phase error $Ø_E[1]$, and the adder 1201_1 may add the delayed gain parameter $K_{TDC1d}$ with the candidate gain parameter $K_{TDC1}$ and update the result into the register Re1.

Note that the embodiments of FIG. 11 and FIG. 12 are for illustrative purposes only, where any circuit architecture that is cable of reaching the same function should belong to the scope of the present invention. A calibration method of an ADPLL may be known according to the embodiments of FIG. 11 and FIG. 12. The calibration method comprises the following steps: utilizing a DCO of the ADPLL to generate a clock signal according to a frequency control signal; utilizing a TDC of the ADPLL to generate a digital output signal according to a phase error between the clock signal and a reference signal; utilizing a normalization circuit of the ADPLL to convert the digital output signal into a clock phase value according to a gain parameter; and utilizing the normalization circuit to select one of a plurality of candidate gain parameters in response to the digital output signal, for being utilized as the gain parameter. Other detailed steps may be deduced according to the previous embodiments, and are therefore omitted here for brevity.

The ADPLL and the calibration method thereof provided by the embodiments of the present invention can select corresponding gain parameters according to the digital output signal, to improve the linearity of the TDC. The calibration method of the present invention is not limited to resolution of the TDC. In addition, the ADPLL and the calibration method will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An all-digital phase-locked loop (ADPLL), comprising:
a digitally controlled oscillator (DCO), configured to generate a clock signal according to a frequency control signal;
a time-to-digital converter (TDC), coupled to the DCO, configured to generate a digital output signal according to a phase error between the clock signal and a reference signal; and
a normalization circuit, coupled to the TDC, configured to convert the digital output signal into a clock phase value according to a gain parameter and storing a plurality of candidate gain parameters, wherein the normalization circuit generates each of the candidate gain parameters according to a product of one of a plurality of previous phase error values and one of a plurality of previous digital output signals;
wherein the normalization circuit selects in response to the digital output signal one of the candidate gain parameters to be the gain parameter.

2. The ADPLL of claim 1, wherein the normalization circuit comprises a least mean square (LMS) circuit, configured to generate a next gain parameter for a next cycle according to a product of the phase error value and the digital output signal and a current gain parameter utilized in a current cycle.

3. The ADPLL of claim 1, wherein the normalization circuit further comprises:
a multiplexer (MUX), controlled by the digital output signal to output one of the candidate gain parameters as the gain parameter;
a de-multiplexer (DEMUX), controlled by a delayed digital output signal, configured to receive a delayed gain parameter which is generated according to the delayed digital output signal, wherein the delayed gain parameter is configured to update a corresponding candidate gain parameter;
a storage device, coupled to a plurality of input terminals of the MUX and a plurality of output terminals of the DEMUX, configured to store the candidate gain parameters; and
a first delay circuit, coupled to the MUX and the DEMUX, configured to receive the digital output signal for generating the delayed digital output signal.

4. The ADPLL of claim 3, wherein the normalization circuit further comprises:
a plurality of registers, configured to store the candidate gain parameters;
a plurality of adders, respectively coupled to the registers and coupled to the DEMUX; and
a plurality of second delayed circuits, respectively coupled to the registers and the adders.

5. A calibration method of an all-digital phase-locked loop (ADPLL), comprising:
utilizing a digitally controlled oscillator (DCO) of the ADPLL to generate a clock signal according to a frequency control signal;
utilizing a time-to-digital converter (TDC) of the ADPLL to generate a digital output signal according to a phase error between the clock signal and a reference signal;
utilizing a normalization circuit of the ADPLL to generate each of the candidate gain parameters according to a product of one of a plurality of previous phase error values and one of a plurality of previous digital output signals;
utilizing the normalization circuit of the ADPLL to convert the digital output signal into a clock phase value according to a gain parameter and storing a plurality of candidate gain parameters; and utilizing the normalization circuit to select in response to the digital output signal one of the candidate gain parameters to be the gain parameter.

6. The calibration method of claim 5, wherein the step of utilizing the normalization circuit of the ADPLL to convert the digital output signal into the clock phase value according to the gain parameter comprises:

utilizing the normalization circuit to multiply the digital output signal by the gain parameter to generate the clock phase value.

7. The calibration method of claim 5, wherein the step of utilizing the normalization circuit to generate each of the candidate gain parameters according to a product of one of the previous phase error values and one of the previous digital output signals comprises:

utilizing a least mean square (LMS) circuit of the normalization circuit to generate a next gain parameter for a next cycle according to a product of the phase error value and the digital output signal and a current gain parameter utilized in a current cycle.

8. The calibration method of claim 5, wherein the step of utilizing the normalization circuit to select one of the plurality of candidate gain parameters in response to the digital output signal for being utilized as the gain parameter comprises:

delaying the digital output signal to generate a delayed digital output signal;

controlling a multiplexer (MUX) by the digital output signal;

controlling a de-multiplexer (DEMUX) by the delayed digital output signal; and controlling the MUX to output which one of the candidate gain parameters stored in a storage device, and utilizing the DEMUX to control the storage device to receive a delayed gain parameter generated according to the delayed digital output signal, wherein the delayed gain parameter is configured to update a corresponding candidate gain parameter.

9. The calibration method of claim 8, wherein updating the corresponding candidate gain parameter comprises:

adding the corresponding candidate gain parameter of the candidate gain parameters stored in the storage device with the delayed again parameter to update the corresponding candidate gain parameter.

\* \* \* \* \*